United States Patent [19]
Lee

[11] Patent Number: 5,831,308
[45] Date of Patent: Nov. 3, 1998

[54] MOSFET HAVING A PARTICULAR SOI STRUCTURE

[75] Inventor: Dong Hoon Lee, Seoul, Rep. of Korea

[73] Assignee: LG Semicon Co., Ltd., Chungcheongbuk-Do, Rep. of Korea

[21] Appl. No.: 731,468

[22] Filed: Oct. 15, 1996

[30] Foreign Application Priority Data

Jun. 10, 1996 [KR] Rep. of Korea .................. 20640/1996

[51] Int. Cl.$^6$ .......................... H01L 27/01; H01L 27/12; H01L 31/0392
[52] U.S. Cl. .......................... 257/347; 257/350; 257/351
[58] Field of Search ................................. 257/347, 348, 257/350, 351, 352, 353

[56] References Cited

U.S. PATENT DOCUMENTS 5,627,395   5/1997   Witek et al. ............................. 257/350

OTHER PUBLICATIONS

"A new CMOS Structure Using a Transistor on a Lateral Epitarial Silicon Layer"; Terada et al, NEC Res & Develop., vol. 32, No. 1 pp. 20–28, Jan. 1991.

*Primary Examiner*—Wael Fahmy
*Attorney, Agent, or Firm*—Morgan, Lewis & Bockius LLP

[57] ABSTRACT

An MOSFET includes a substrate, an active region on the substrate, a first insulating element and a second insulating element located a distance apart from each other on the active region, the first and second insulating elements dividing the active region into a source region, a drain region, and a channel region, the channel region being disposed between the source region and the drain region, a third insulating film over the active region between the first and second insulating films, and a gate electrode over the third insulating film.

18 Claims, 10 Drawing Sheets

MOSFET HAVING A PARTICULAR SOI STRUCTURE

BACKGROUND OF THE INVENTION

1. Field of the Invention

The present invention relates to an MOSFET, and more particularly, to a structure and fabricating method of an MOSFET.

2. Discussion of the Related Art

There has been a general trend for the past ten years towards micronization and high device density packing of MOS devices. The number of devices packed on a single chip has doubled every year. To meet this trend, the size and parasitic capacitance of the device needed reduction for obtaining a high speed device which is packed under ultra large scale integration (ULSI).

However, a conventional bulk CMOS structure has the following problems in reducing the size and parasitic capacitance of the device. First, it is impossible to reduce the width of isolation between a P-channel and N-channel without loss of the latch-up immunity. Second, an alpha particle that induces soft error problems places limitations on the amount of minimum singular charge, which in turn places limitations on the size of the device and voltage supply. Third, the parasitic capacitance between the source/drain and the substrate limits reduction of the device size.

In the meantime, an SOI (Silicon-On-Insulator) has been very effective for reducing the size and parasitic capacitance of the device, because it can provide ideal isolation and low parasitic resistance. Accordingly, the SOI structure is partly combined with the CMOS structure for providing effects identical to the SOI structure.

However, although the CMOS structure to which the SOI has been partly combined has been very effective for the next generation ULSI devices, it has many problems. Such problems include a limitation on the amount of reduction of the channel length and longer manufacturing time.

A conventional MOSFET structure and a method for fabricating the conventional MOSFET structure will be explained hereinafter with reference to the attached drawings.

Figure 1:
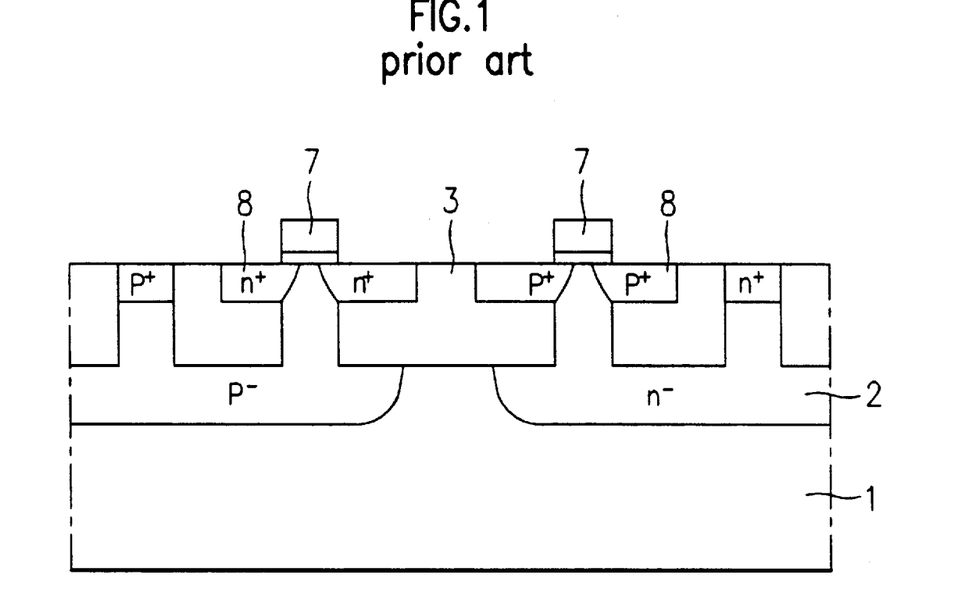
FIG. 1 illustrates a section of a conventional MOSFET structure.

FIG. 1 illustrates a section of a conventional MOSFET structure. As shown in FIG. 1, the conventional MOSFET includes a gate electrode 7 formed on a substrate 1, a source region and a drain region 8 formed in the substrate 1 at both sides of the gate electrode 7, an oxide film 3 having vertical sidewalls formed to surround the source region and drain region 8, and a well region 2 formed below the oxide film 3 containing the source region and the drain region 8.

Figure 2A:
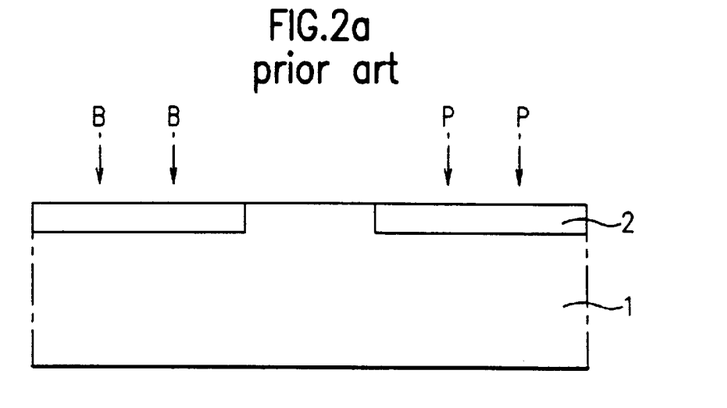
FIGS. 2a to 2f illustrate sections showing steps of a conventional method for fabricating an MOSFET.

FIGS. 2a to 2f illustrate a conventional method for fabricating an MOSFET. As shown in FIG. 2a, a field region and an active region are defined on a semiconductor substrates 1. The active region is subjected to boron and phosphor ion injection, for the first time, for forming an N-well and a P-well to form well regions 2.

Figure 2B:
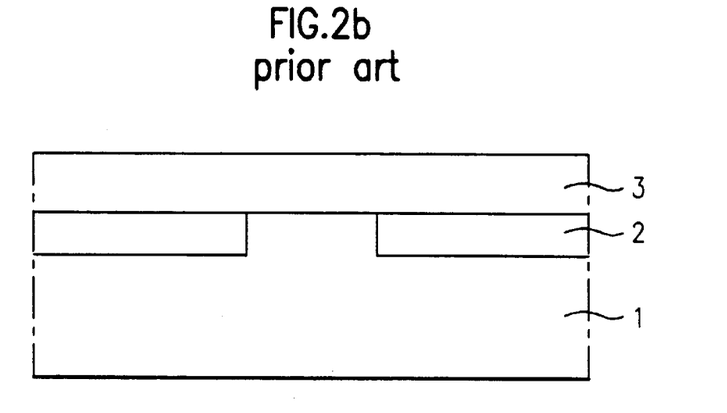
Figure 2C:
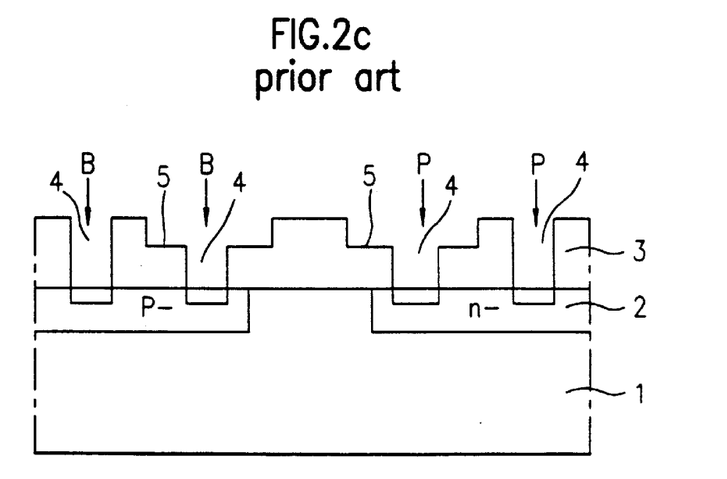

As shown in FIG. 2b, the substrate 1 is thermally oxidized to form an oxide film 3 on an entire surface of the substrate 1. As shown in FIG. 2c, the oxide film 3 is selectively etched to form contact holes 4 which expose the well regions 2.

Each of the contact holes 4 is etched so that the contact hole 4 has a recessed region 5 at an upper part of the contact hole 4. The recessed region 5 determines the device size and seed regions as well as the depth of the source and drain.

In order to adjust an impurity concentration in a depth of an epitaxial silicon layer, boron (B) and phosphorous (P) ions are injected, for the second time, into the substrate 1 having the contact holes 4, formed thereon.

Figure 2D:
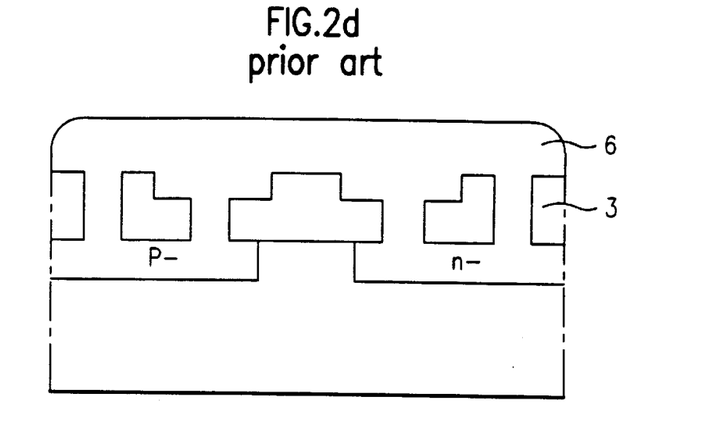
Figure 2E:
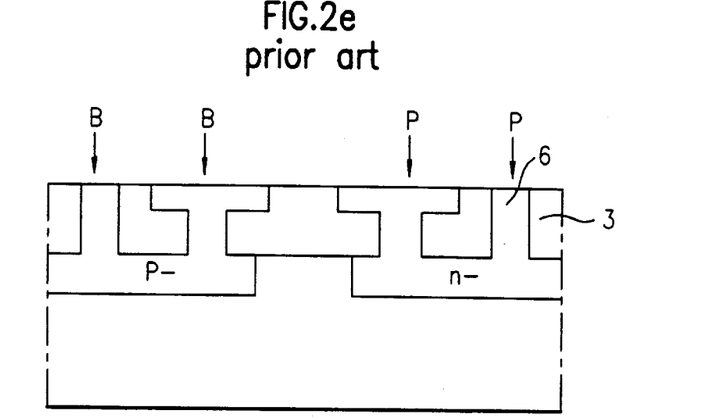

As shown in FIG. 2d, an undoped epitaxial silicon layer 6 is selectively grown starting from the contact holes 4, each having the recessed region 5. As shown in FIG. 2e, the epitaxial silicon layer is polished selectively to expose the oxide film 3.

In order to fix transistor performances, boron (B) and phosphorous (P) ions are injected, for the third time, into the epitaxial silicon layers 6 remained between the oxide films 3.

Figure 2F:
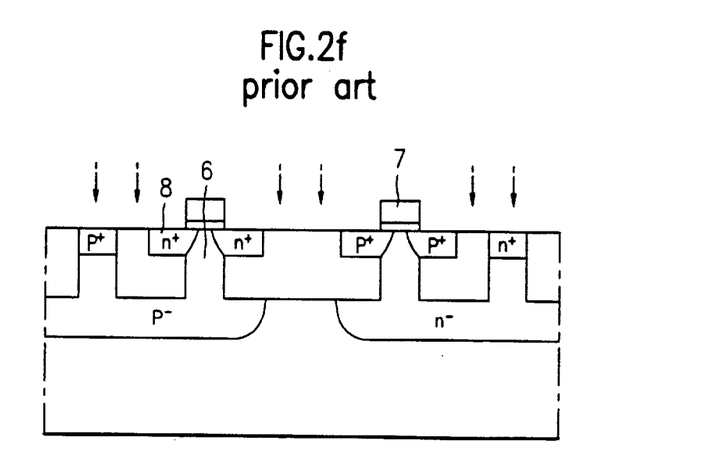

As shown in FIG. 2f, a gate electrode 7 is formed on each of the epitaxial silicon layers 6 which are surrounded by the oxide films 3, and ions are injected into the substrate 1 on both sides of the gate electrodes 7 to form the source and drain regions 8.

However, the aforementioned conventional MOSFET structure and the fabricating method have the following problems. First, due to the punch through effect between the source and drain, decreasing of the channel length is limited. Second, the epitaxial silicon layer growth takes a long time. Third, it is hard to control the distance between the N-well and the P-well due to the lengthy time required for growing the epitaxial layer.

SUMMARY OF THE INVENTION

Accordingly, the present invention is directed to an MOSFET structure and method for fabricating the same that substantially obviates one or more of the problems due to limitations and disadvantages of the related art.

An object of the present invention is to provide a method and structure for shortening the channel length of the MOSFET while maintaining the reliability of a semiconductor device.

Another object of the present invention is to improve the reliability of a semiconductor device and simplifying the manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the MOSFET structure includes a substrate having an active region under a surface of the substrate, a first insulating film and a second insulating film formed a distance apart from each other in the active region and dividing the active region into a source region, a drain region and a channel region disposed between the source region and the drain region, and a gate electrode formed on the surface of the active region extended between the first, and second insulating films.

In another aspect, the present invention provides the MOSFET structure, including a substrate, an active region on the substrate, a first insulating film and a second insulating film located a distance apart from each other on the active region, the first and second insulating films dividing the active region into a source region, a drain region and a channel region, the channel region being disposed between the source region and the drain region, a third insulating film over the active region between the first and second insulating films, and a gate electrode over the third insulating film.

In another aspect, the present invention provides a method for fabricating an MOSFET structure including the steps of forming a first insulating film and a second insulating film on a semiconductor substrate in a succession, patterning the first, and second insulating films to remove the second insulating film in its entirety within a predetermined width and the first insulating film up to a predetermined depth from a surface thereof to form recesses, forming first sidewall spacers at both sides of each of the recesses, forming second sidewall spacers at both sides of each of the first sidewall spacers, conducting etching with remained second insulating films and the second sidewall spacers used as etch masks to remove the first sidewall spacers and the underlying first insulating films for selective exposure of surfaces of the substrate and leaving insulating film patterns under the second sidewall spacers, injecting impurity ions through the exposed substrate surfaces and diffusing the impurity ions for forming wells under the surfaces of the substrate, removing remained second insulating films, and second sidewall spacers, growing an epitaxial growth layer up to surfaces of the remained first insulating films using the wells as seeds, forming a gate electrode on a surface of the epitaxial growth layer between the remained first insulating films, and injecting impurity ions into the epitaxial growth layer with the gate electrode used as a mask to form a source region and a drain region.

In another aspect, the present invention provides a method for fabricating an MOSFET including the steps of forming a first insulating film and a second insulating film on a semiconductor substrate in succession, removing a portion of the second insulating film to form a first recess, removing a portion of the first insulating film corresponding to the first recess to form a second recess in the first insulating film, forming first sidewall spacers at both sides the recesses, forming second sidewall spacers on the first sidewall spacers, removing the first sidewall spacers and the underlying portion of first insulating films to expose corresponding surface of the substrate, injecting first impurity ions through the exposed substrate surfaces and diffusing the impurity ions for forming wells in the substrate, removing remaining portions of the second insulating film and second sidewall spacers, and growing an epitaxial layer over the substrate, forming a gate insulating layer on the epitaxial layer, forming a gate electrode on the gate insulating layer, and injecting second impurity ions into the epitaxial layer using the gate electrode as a mask to form a source region and a drain region.

In another aspect, the present invention provides an MOSFET comprising a substrate, an active region on the substrate, a first insulating element and a second insulating element located a distance apart from each other on the active region, the first and second insulating elements dividing the active region into a source region, a drain region and a channel region, the channel region being disposed between the source region and the drain region, a third insulating film over the active region between the first and second insulating films, and a gate electrode over the third insulating film.

In a further aspect, the present invention provides a method for fabricating an MOSFET comprising the steps of forming a first insulating film and a second insulating film on a semiconductor substrate in succession, removing a portion of the second insulating film to form a first recess, removing a portion of the first insulating film corresponding to the first recess to form a second recess in the first insulating film, forming first sidewall spacers at both sides the recesses, forming second sidewall spacers on the first sidewall spacers, removing the first sidewall spacers and the underlying portion of first insulating films to expose corresponding surface of the substrate, injecting first impurity ions through the exposed substrate surfaces and diffusing the impurity ions for forming wells in the substrate, removing remaining portions of the second insulating film and second sidewall spacers, and growing an epitaxial layer over the substrate, forming a gate insulating layer on the epitaxial layer, forming a gate electrode on the gate insulating layer, and injecting second impurity ions into the epitaxial layer using the gate electrode as a mask to form a source region and a drain region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
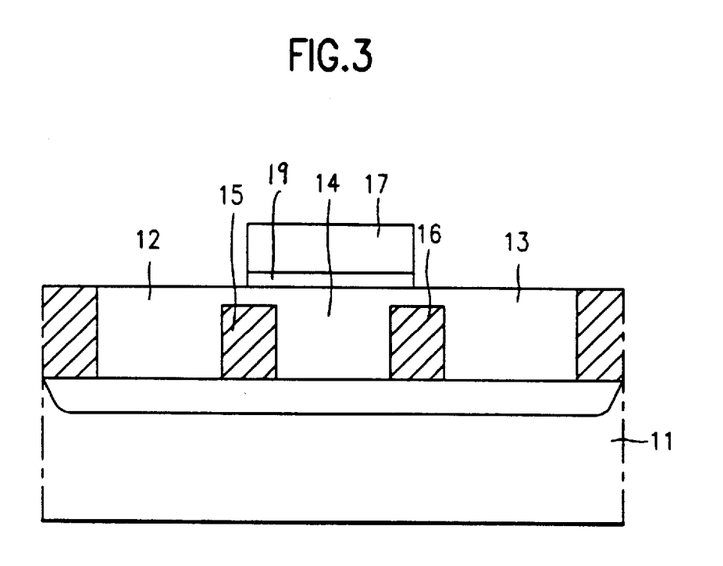
FIG. 3 illustrates a section of an MOSFET structure in accordance with a first embodiment of the present invention.

An MOSFET structure and a method for fabricating the MOSFET structure will be explained in detail with reference to the attached drawings. FIG. 3 illustrates a section of the MOSFET structure in accordance with a first embodiment of the present invention.

As shown in FIG. 3, the MOSFET structure in accordance with the first embodiment of the present invention includes a substrate 11 having an active region under a surface of the substrate 11, and a first insulating element 15 and a second insulating element 16 formed a distance apart from each other in the active region. The first insulating element 15 and the second insulating element 16 divide the active region into a source region 12, a drain region 13, and a channel region 14 disposed between the source region 12 and the drain region 13. A gate electrode 17 is formed on a gate insulator 19 over the surface of the active region and extends between the first and second insulating elements 15 and 16. The first insulating element 15 and the second insulating element 16 are formed on a surface of the active region and, preferably, each of the first and second insulating element is of one body. The top surface of each of the first and second insulating elements is disposed under the surface of the active region. Thus, channel 14 is defined by the first and second insulating elements.

Figure 4A:
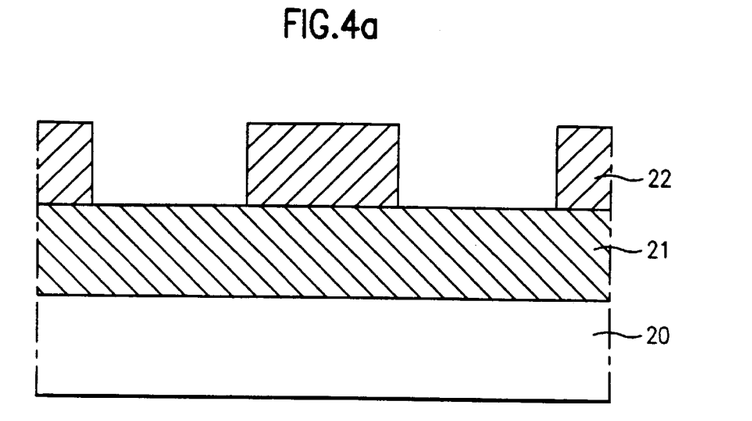
FIGS. 4a to 4e illustrate sections showing steps of a method for fabricating an MOSFET in accordance with a first embodiment of the present invention.
Figure 4B:
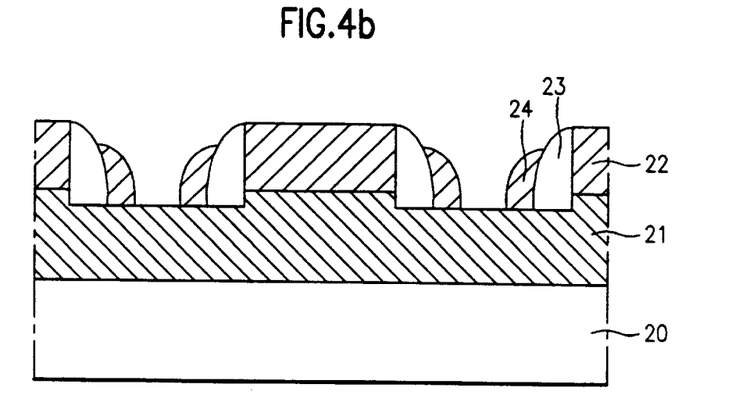

FIGS. 4a to 4e illustrate sections showing steps of a method for fabricating an MOSFET in accordance with a first embodiment of the present invention. As shown in FIG. 4a, a first insulating film 21 and a second insulating film 22 are formed on a semiconductor substrate 20 in succession. The first insulating film 21 and the second insulating film 22 are patterned to remove portions of the second insulating film 22 to form recesses. The recesses extended below the surface of the insulating film 21 to a predetermined depth, as shown in FIGS. 4a and 4b. The removal of the first insulating film up to the predetermined depth fixes or determines a channel depth of the MOSFET.

Referring to FIG. 4b, polysilicon is deposited over the entire surface of the substrate 20, and selectively etched back to form first sidewall spacers 23 at both sides of each of the recesses. A third insulating film is deposited over the entire surface of the substrate 20 including the first sidewall spacers 23, and selectively etched back to form second sidewall spacers 24 at sides of each of the first sidewall spacers 23. Preferably, the second sidewall spacers 24 are formed of the same material as the second insulating film 22.

Figure 4C:
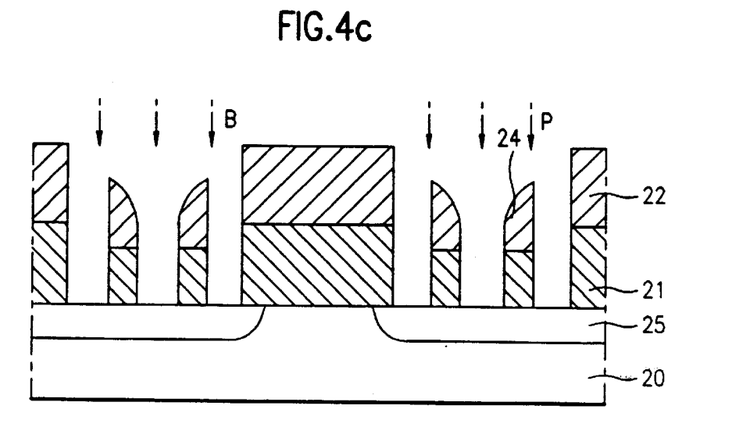

As shown in FIG. 4c, the first sidewall spacers 23 and portions of the first insulating film 21 beneath the first sidewall spacers 23 are removed using the remaining second insulating films 22 and second sidewall spacers 24 used as etch masks to selectively expose the surface of the substrate 20. Thus, the first insulating film 21 is patterned to have corresponding portions of the first insulating film 21 under the second spacers 24.

Impurity ions are injected through the exposed surfaces of the substrate 20, for the first time, which are then diffused to form wells 25 under the surface of the substrate 20. In this case, a region having boron B ions injected thereto becomes a P-well region, and a region having phosphor P ions injected thereto becomes an N-well region.

Figure 4D:
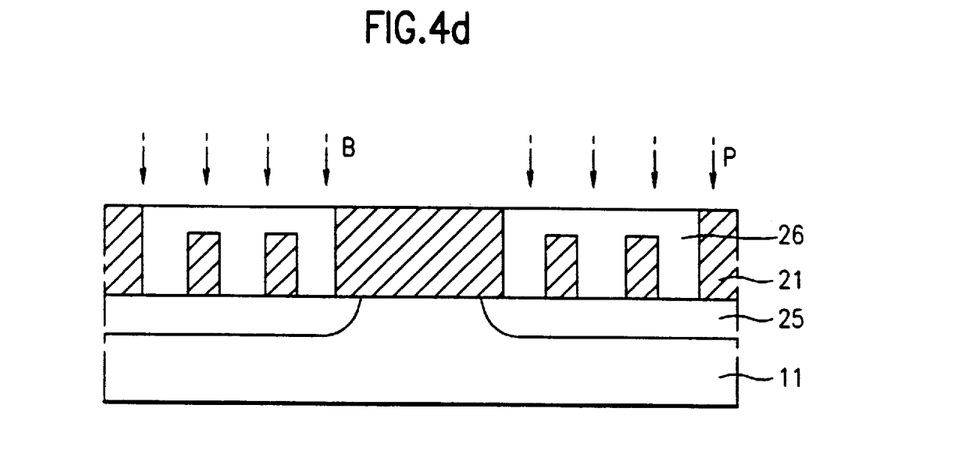

Referring to FIG. 4d, the remaining second insulating films 22 and second sidewall spacers 24 are removed, and an epitaxial growth layer 26 is formed up to the surface of the remaining first insulating film 21. The epitaxial growth layer 26 is planarized by an etch back process, into which impurity ions are injected for the second time for adjusting an impurity concentration therein. Impurity ions are injected into the epitaxial growth layer 26, for the third time, to fix the characteristics of the epitaxial growth layer 26 in a transistor.

Figure 4E:
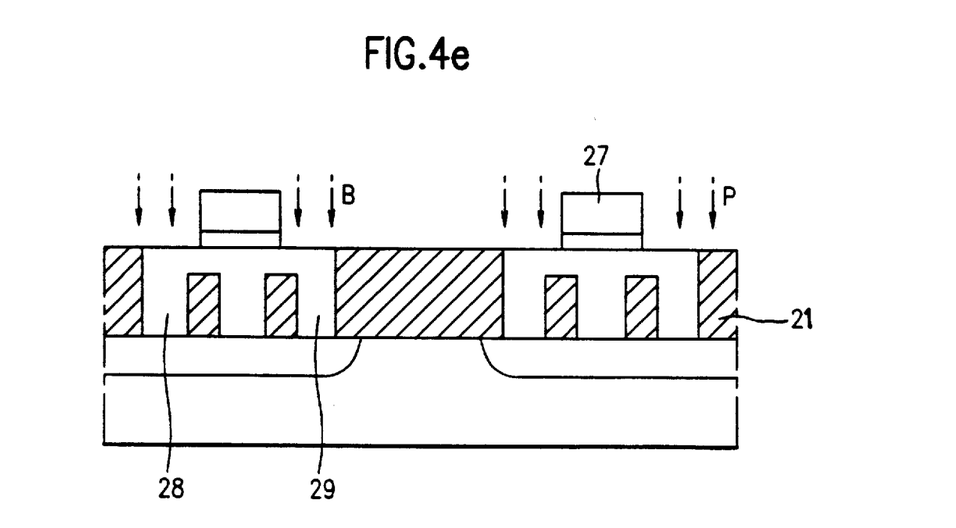

As shown in FIG. 4e, gate electrodes 27 are formed on the surface of the epitaxial growth layer 26 between the remaining first insulating film 21 patterns. Impurity ions are injected into the epitaxial growth layer 26, for the fourth time, using the gate electrodes 27 as masks to form source regions 28 and drain regions 29.

Figure 5:
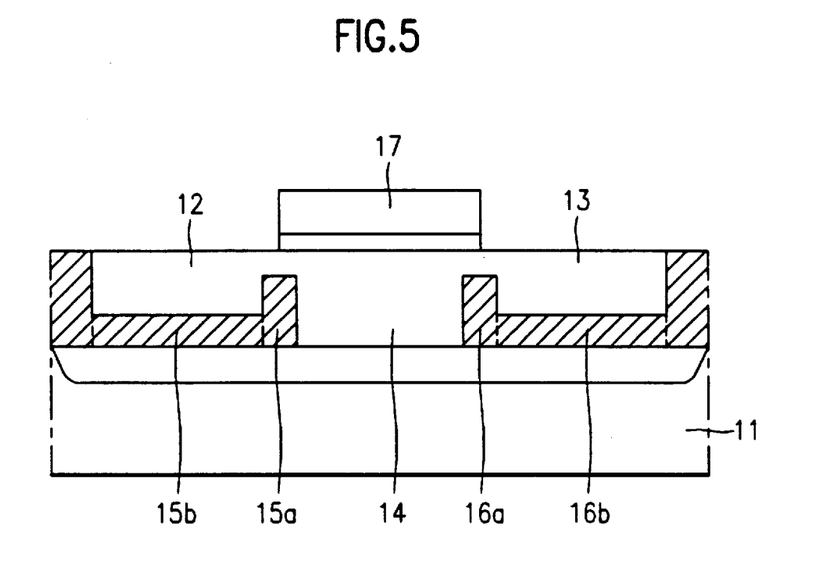
FIG. 5 illustrates a section of an MOSFET structure in accordance with a second embodiment of the present invention.

FIG. 5 illustrates a section of an MOSFET structure in accordance with a second embodiment of the present invention.

As shown in FIG. 5, the second embodiment of the MOSFET structure of the present invention includes a substrate 11 having an active region under a surface thereof, and a first insulating element 15 and a second insulating element 16 formed a distance apart from each other in the active region. The first and second insulating elements dividing the active region into a source region 12, a drain region 13, and a channel region 14 disposed between the source region 12 and the drain region 13. The first insulating element 15 has a main body 15a formed on a bottom surface of the active region with a first width and a first height and an extended body 15b formed on a bottom surface of the source region 12. The extended body having a second height lower than the first height extends from the main body 15a toward the opposite direction of the channel region 14. The second insulating element 16 has a main body 16a formed on the bottom surface of the active region having the first width and the first height and an extended body 16b extending from the main body 16a on a bottom surface of the drain region 13. The extended body 16b has a second height. A gate electrode 17 is formed on an insulator over the surface of the active region disposed between the two insulating regions.

In this case, the upper surfaces of the main bodies 15a and 16a are disposed below the surface of the active region.

Figure 6A:
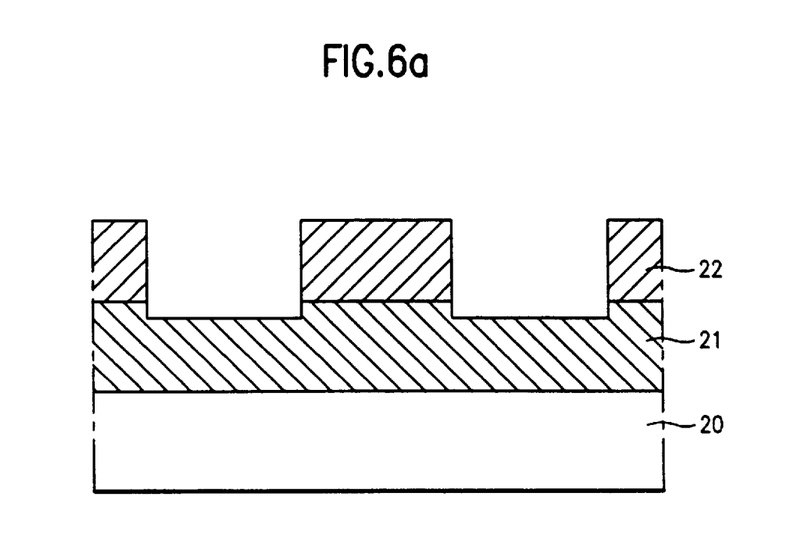
FIGS. 6a to 6f illustrate sections showing steps of a method for fabricating an MOSFET in accordance with a second embodiment of the present invention.

FIGS. 6a to 6f illustrate sections showing steps of a method for fabricating an MOSFET in accordance with a second embodiment of the present invention. As shown in FIG. 6a, a first insulating film 21 and a second insulating film 22 are formed on a semiconductor substrate 20 in succession. The first insulating film 21 and the second insulating film 22 are patterned so that portions of the second insulating film 22 having a predetermined width are removed. The first insulating film 21 is also removed to a predetermined depth to form recesses, as shown in FIG. 6a. In this case, the removal of the first insulating film to the predetermined depth fixes or determines a channel depth of the MOSFET.

Figure 6B:
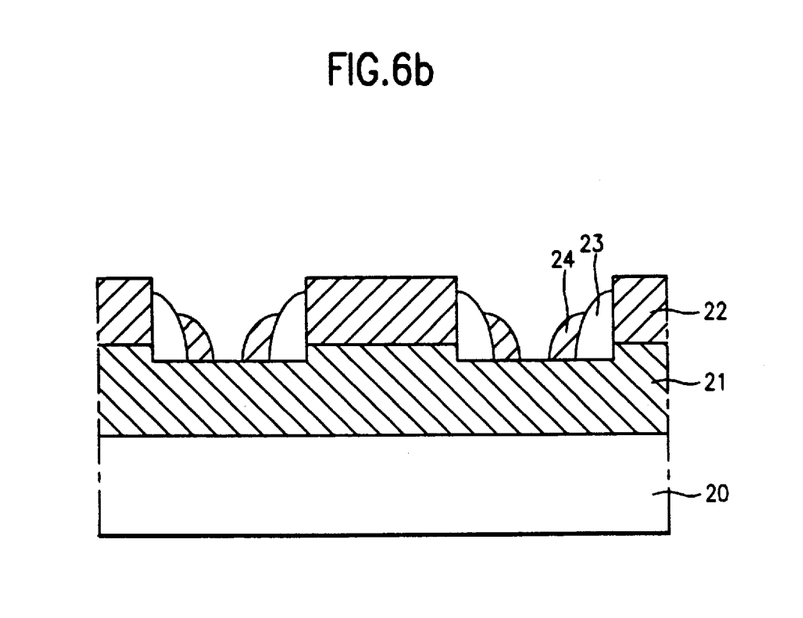

Referring to FIG. 6b, polysilicon is deposited over the entire surface of the substrate 20, and selectively etched back to form first sidewall spacers 23 at both sides of the recesses. A third insulating film is deposited over the entire surface of the substrate 20 including the first sidewall spacers 23, and selectively etched back to form second sidewall spacers 24 at sides of each of the first sidewall spacers 23. Preferably, the second sidewall spacers 24 are formed of the same material as the second insulating film 22.

Figure 6C:
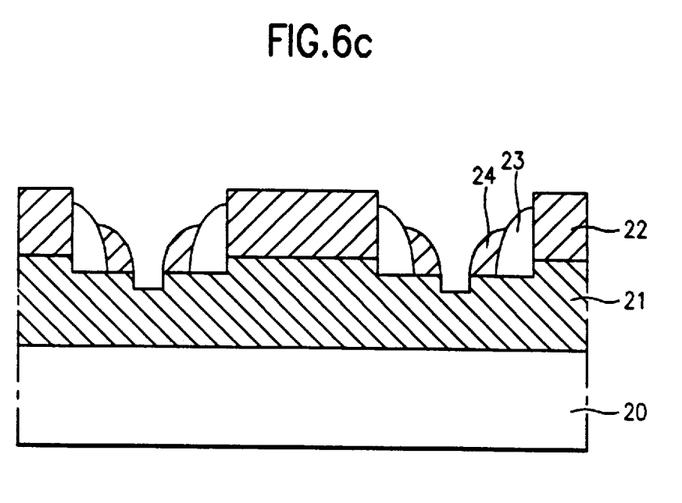

As shown in FIG. 6c, the first insulating film 21 is further removed for the second time to a predetermined depth using the second insulating film 22 and the first and second sidewall spacers as masks. In this case, the depth of the second removal of the first insulating film 21 is identical to the depth of the first removal.

Figure 6D:
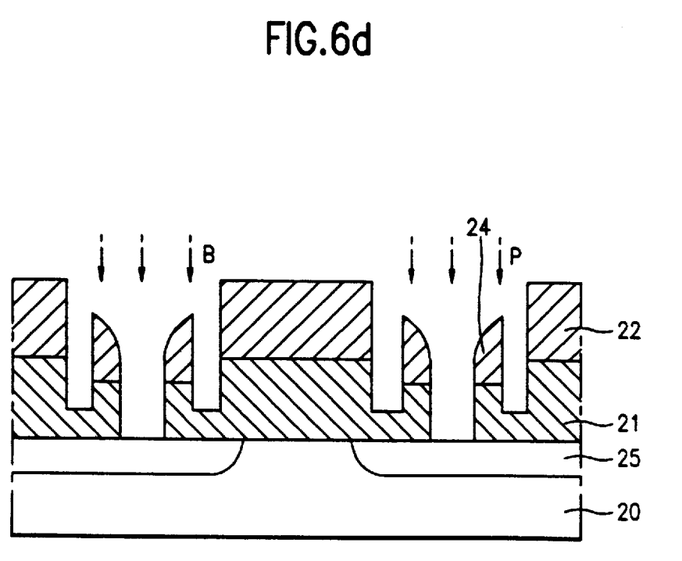

As shown in FIG. 6d, the first sidewall spacers 23 and the first insulating film 21 are removed for a third time using the remaining second insulating film 22 and second sidewall spacers 24 as etch masks to leave a part of the insulating film 21 under the first sidewall spacers 23.

Impurity ions are injected through exposed surfaces of the substrate 20, for the first time, which are then diffused to form wells 25 under the surface of the substrate 20. In this case, a boron B ion injected region becomes a P-well region and a phosphorous P ion injected region becomes an N-well region.

Figure 6E:
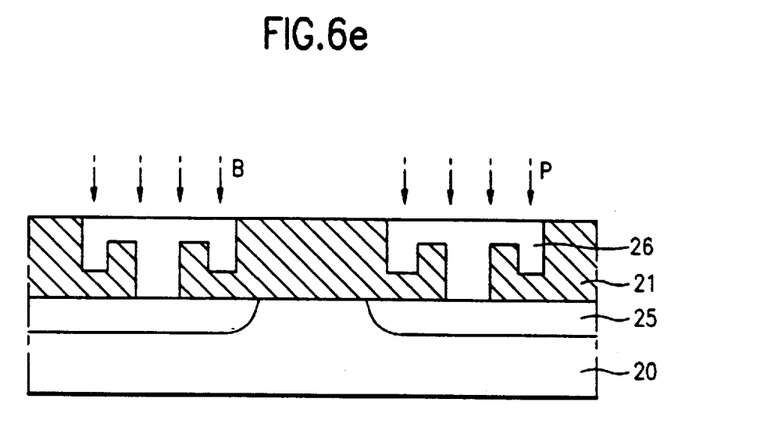

Referring to FIG. 6e, the remaining second insulating film 22 and second sidewall spacers 24 are removed, and an epitaxial growth layer 26 is formed up to a surface of the remaining first insulating film 21, using the wells 25 as seeds. The epitaxial growth layer 26 is planarized by an etch back process, into which impurity ions are injected, for the second time, to adjust an impurity concentration in the epitaxial layer 26. Impurity ions are injected, for the third time, to fix characteristics of the epitaxial layer 26 in a transistor.

Figure 6F:
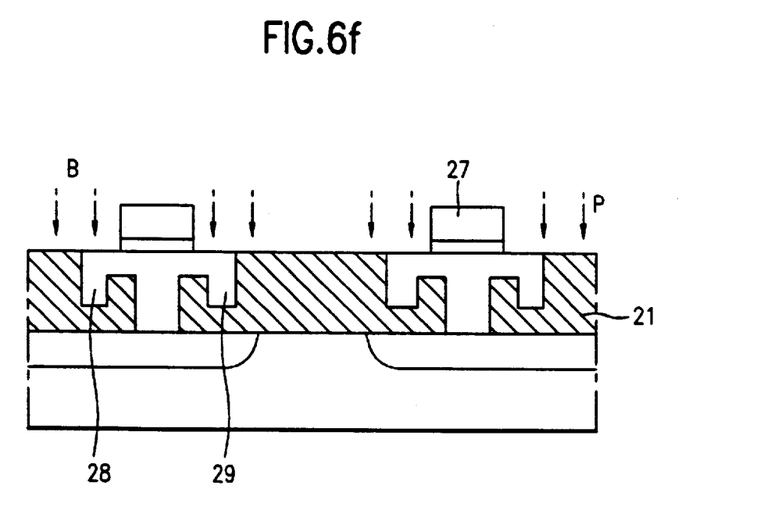

As shown in FIG. 6f, a gate electrode 27 is formed on a surface of the epitaxial growth layer 26 between the remaining first insulating film 21 patterns. Impurity ions are injected into the epitaxial growth layer 26, for the fourth time, using the gate electrode 27 as a mask to form a source region 28 and a drain region 29.

Accordingly, the structure and fabricating method of an MOSFET of the present invention have the following advantages.

First, the barrier between the source region and the drain region by means of the insulating film prevents problems from punch through, and allows a maximum reduction of the channel length. Second, the electric field reduction in the drain region helps to improve the reliability of the device. Third, the increased seed area in the epitaxial growth makes the fabrication process easy.

It will be apparent to those skilled in the art that various modifications and variations can be made in method for fabricating semiconductor device of the present invention without departing from the spirit or scope of the invention. Thus, it is intended that the present invention cover the modifications and variations of this invention provided they come within the scope of the appended claims and their equivalents.

What is claimed is:

1. An MOSFET comprising:

a substrate;

an active region on the substrate;

a first insulating element and a second insulating element located a distance apart from each other in the active region, the first and second insulating elements dividing the active region into a source region, a drain region and a channel region, the channel region being disposed between the source region and the drain region;

a third insulating element over the active region between the first and second insulating elements, the third insulating element being substantially as wide as or wider than the distance between the first and second insulating elements; and a gate electrode over the third insulating element.

2. An MOSFET as claimed in claim 1, wherein the first and second insulating elements are at a bottom of the active region.

3. An MOSFET as claimed in claim 1, wherein the first and second insulating elements have top surfaces below a surface of the active region.

4. An MOSFET as claimed in claim 1, wherein the first insulating element is located between the source region and the channel region, and the second insulating elements is located between the channel region and the drain region.

5. An MOSFET as claimed in claim 1, wherein uppermost surfaces of the first and second insulating elements are below a surface of the active region.

6. An MOSFET as claimed in claim 5, wherein a distance between the surface of the active region and the uppermost surfaces of the first and second insulating elements defines a channel depth of the MOSFET.

7. An MOSFET as claimed in claim 1, wherein a well containing impurity ions is formed under the active region below a surface of the substrate.

8. An MOSFET as claimed in claim 1, wherein at least one of the first and second insulating elements includes a first portion having a first height and a second portion having a second height, the second portion extending from the first portion in a direction opposite to the channel region.

9. An MOSFET comprising:

a substrate;

an active region on the substrate;

a first insulating element and a second insulating element located a distance apart from each other in the active region, the first and second insulating elements dividing the active region into a source region, a drain region and a channel region, the channel region being disposed between the source region and the drain region;

a third insulating element over the active region between the first and second insulating elements; and a gate electrode over the third insulating element, wherein a distance between a surface of the active region and uppermost surfaces of the first and second insulating elements defines a channel depth of the MOSFET.

10. An MOSFET as claimed in claim 4, wherein at least one of the first and second insulating elements includes a first portion having a first height and a second portion having a second height, the second portion extending from the first portion in a direction opposite to the channel region.

11. An MOSFET as claimed in claim 9, wherein the first and second insulating elements are at a bottom of the active region.

12. An MOSFET as claimed in claim 9, wherein a well containing impurity ions is formed under the active region below a surface of the substrate.

13. An MOSFET comprising:

a substrate;

an active region on the substrate;

a first insulating element and a second insulating element located a distance apart from each other in the active region, the first and second insulating elements dividing the active region into a source region, a drain region and a channel region, the channel region being disposed between the source region and the drain region;

a third insulating element over the active region between the first and second insulating elements, the third insulating element being substantially as wide as or wider than the distance between the first and second insulating elements; and a gate electrode over the third insulating element, wherein at least one of the first and second insulating elements extends over the substrate in a direction opposite to the channel region.

14. An MOSFET as claimed in claim 13, wherein at least one of the first and second insulating elements includes a first portion having a first height and a second portion having a second height, the second portion extending from the first portion in a direction opposite to the channel region.

15. An MOSFET as claimed in claim 13, wherein the first and second insulating elements are at a bottom of the active region.

16. An MOSFET as claimed in claim 13, wherein uppermost surfaces of the first and second insulating elements are below a surface of the active region.

17. An MOSFET as claimed in claim 16, wherein a distance between the surface of the active region and the uppermost surfaces of the first and second insulating elements defines a channel depth of the MOSFET.

18. An MOSFET as claimed in claim 13, wherein a well containing impurity ions is formed under the active region below a surface of the substrate.

* * * * *